United States Patent [19]

Chen

[11] Patent Number: 4,624,014

[45] Date of Patent: Nov. 18, 1986

[54] SIGNAL-SEEKING TUNING SYSTEM WITH A SEACHING MODE ACTIVATED BY THE USER'S OPERATION OF A MANUAL BAND SWITCH

[75] Inventor: Keming J. Chen, San Diego, Calif.

[73] Assignee: RCA Corporation, Princeton, N.J.

[21] Appl. No.: 573,226

[22] Filed: Jan. 23, 1984

[51] Int. Cl.⁴ .............................................. H03J 7/18
[52] U.S. Cl. .................... 455/168; 455/169; 455/180
[58] Field of Search .............. 455/161, 168, 169, 164, 455/180, 188, 176; 358/193.1

[56] References Cited

U.S. PATENT DOCUMENTS

| | | | |
|---|---|---|---|
| 3,584,141 | 6/1971 | Fujiwara | 455/168 |
| 3,651,411 | 3/1972 | Zlotnick | 455/168 |
| 3,824,475 | 6/1974 | Pflasterer | 455/168 |
| 3,958,180 | 5/1976 | George | 455/180 |
| 3,980,957 | 9/1976 | Putzer . | |
| 4,147,987 | 3/1979 | Imamura | 455/168 |
| 4,317,225 | 2/1982 | Henderson | 455/169 |
| 4,398,303 | 8/1983 | Chin et al. . | |
| 4,499,495 | 2/1985 | Strammello | 455/191 |
| 4,521,915 | 6/1985 | Baker et al. | 455/168 |

Primary Examiner—Jin F. Ng
Assistant Examiner—Curtis Kuntz
Attorney, Agent, or Firm—E. M. Whitacre; P. J. Rasmussen; P. M. Emanuel

[57] ABSTRACT

An automatic signal-seeking television receiver has a pair of capacitors for developing tuning voltages for the VHF and UHF bands, respectively. A manual bandswitch arrangement for selecting the frequency band of the tuner, selects one of the capacitors for developing the tuning voltage for the selected band and applies a predetermined voltage, e.g. ground, to the capacitor for the non-selected band. Thus, after bandswitching, the signal-seeking always automatically starts from a predetermined frequency, e.g. the lower frequency boundary of the selected band. A charging circuit charges or discharges the capacitor for the selected band to provide frequency sweep in accordance with the operation of one of a pair of manual tuning direction setting switches. A direction reversing circuit is used to reverse the direction of the frequency sweep if no signal is found by the time the sweep reaches a frequency boundary of a selected band and also is responsive to the predetermined voltage initially developed by the capacitor of the newly selected band after manual bandswitching to automatically start the frequency sweep.

10 Claims, 1 Drawing Figure

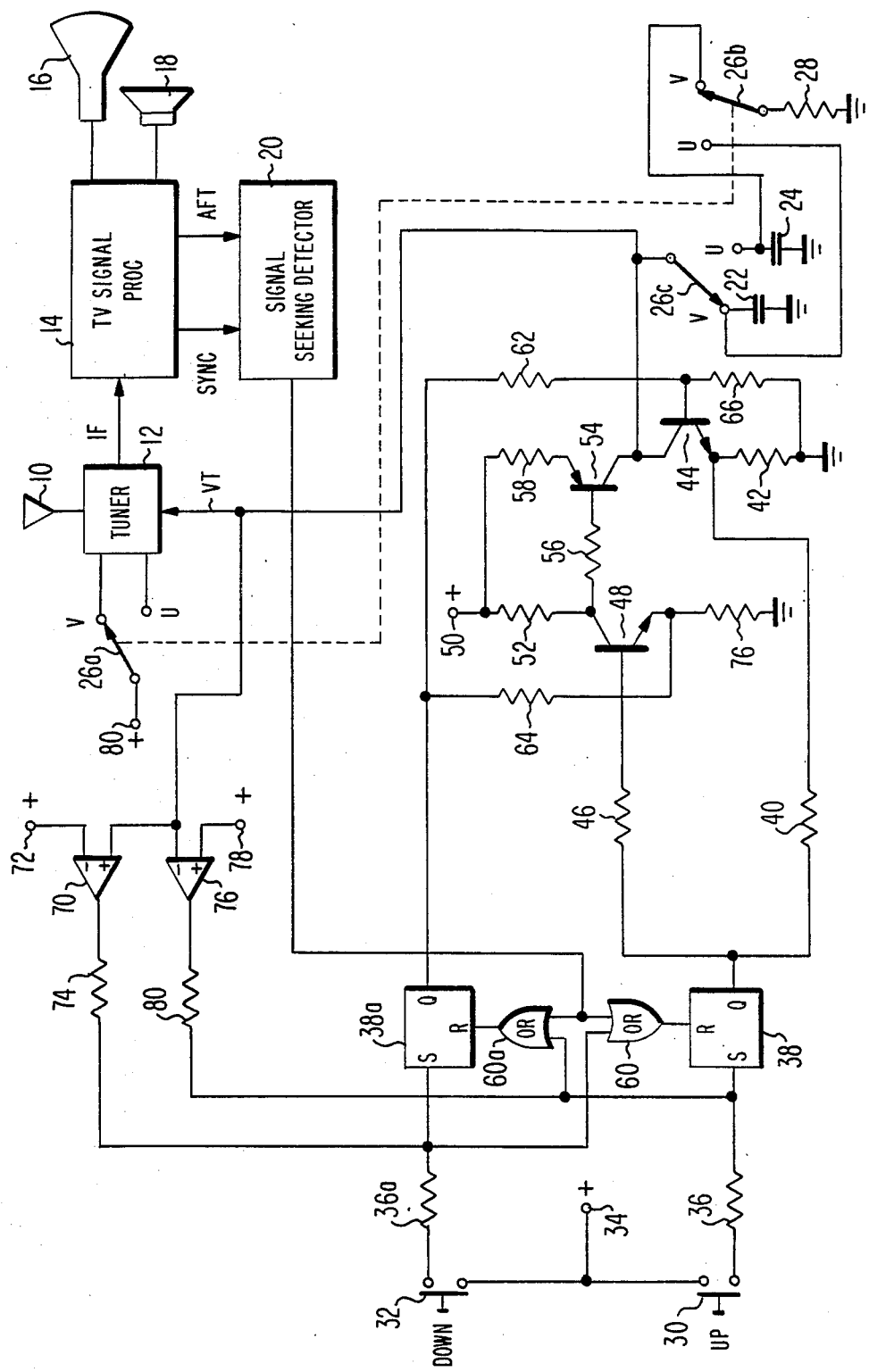

SIGNAL-SEEKING TUNING SYSTEM WITH A SEACHING MODE ACTIVATED BY THE USER'S OPERATION OF A MANUAL BAND SWITCH

The present invention relates to signal-seeking tuning systems, and, more particularly, to such tuning systems with manual bandswitching.

A multi-band signal-seeking tuning system with automatic bandswitching is disclosed in U.S. Pat. No. 4,398,303. In this system, an up/down counter counts clock pulses to provide successive binary words to a digital-to-analog converter. The converter applies an analog tuning voltage to voltage variable capacitance tuning diodes in a tuner so that channels are successively tuned until an active channel is found. If an active channel is not found in one band by the time the counter has reached one of its limit counts (i.e., either the maximum count if the signal-seeking is in the increasing frequency sense or the minimum count if the signal-seeking is in the decreasing frequency sense), the counter cycles to the opposite limit count, and the next band is automatically selected and scanning again starts from the new limit.

However, for reasons of economy, it may not be desirable to provide the circuitry for automatic bandswitching but rather to have the bandswitching manually controllable by a user.

A problem with such a manually controllable circuit is that when a user manually selects a new band, the tuning voltage for the new band is indeterminate and usually does not correspond to an active channel. Thus, the viewer usually will be presented with an unviewable image and may thereby be confused as how to proceed. If the user happens to activate the signal-seeking operation by pressing a pushbutton provided for that purpose, the signal-seeking operation starts from an indeterminate point, and therefore may not cover the new band entirely.

In accordance with the present invention, a signal-seeking tuning system for locating active channels in a plurality of bands includes a manual bandswitching arrangement for selecting the band to be searched and apparatus coupled to the manual bandswitching arrangement for automatically starting a new signal-seeking operation when a new band is selected in a predetermined sense from a predetermined point selected so that the entire new band is searched. In a preferred embodiment, a capacitor for storing a tuning frequency voltage is provided for each band. A manual bandswitch automatically sets the tuning voltage across the capacitor for a newly selected band to a preselected level, depending upon the band selected, corresponding to a frequency limit of the band upon manual activation of the bandswitch.

These and other aspects of the invention will be described with reference to the Drawing consisting of a sole FIGURE which is a partly block and partly schematic diagram of the preferred embodiment of the invention.

In the arrangement shown in the Drawing, radio frequency (RF) signals are received by an antenna 10 and applied to a tuner 12. Tuner 12 selects a particular RF signal in accordance with a bandswitching voltage at terminal 80 applied to it by manual switch 26a and also in accordance with magnitude of a tuning voltage VT applied to it. The bandswitching voltage energizes one of a VHF or UHF RF stage within tuner 12 in accordance with the position of switch 26a, while VT determines a selected channel within the selected band. Tuner 12 converts the received RF signals to an IF signal. The IF signal is applied to a television signal processing circuit 14 which provides a video signal to a cathode ray tube (CRT) 16 and an audio signal to loudspeaker 18. Circuit 14 also provides synchronization (sync) pulses and an automatic fine tuning (AFT) signal to a signal-seeking detector 20. Detector 20 provides an output signal when the AFT and sync pulses indicate that a received RF signal corresponds to an active television channel.

The tuning voltage VT is supplied by capacitor 22 for the VHF band and by capacitor 24 for the UHF band by way of a switch section 26c of a manual bandswitching arrangement. In accordance with a feature of the invention, switch section 26b of the manual bandswitching arrangement, which is ganged with switches 26a and 26c as shown by dotted lines, connects whichever one of capacitors 22 or 24 is not selected to ground through resistor 28. For example, for the positions of switches 26c and 26b as shown, while the VHF band is selected so that capacitor 22 is supplying VT, capacitor 24 is grounded through resistor 28. Thus, when the UHF band is newly selected, capacitor 24 will be charged to a predetermined voltage, i.e., zero volts in this embodiment. Since the predetermined voltage of zero is selected to correspond to a point on the tuning voltage versus channel frequency characteristic of the UHF band below the lowest active channel in the UHF band, e.g., channel 14 in the United States, the signal-seeking operation is automatically started at a point which ensures that the UHF band will be entirely searched. Similarly, if the VHF range is selected, the searching starts from channel 2 due to setting the charge on capacitor 22 for the VHF band to correspond to zero volts. Preferably, capacitor 22 for the VHF band has a smaller value than capacitor 24 for the UHF band so that searching is faster in the VHF band than in the UHF band since there are normally fewer stations in the VHF band than the UHF band.

As will be described below, in the embodiment shown in the FIGURE initially setting tuning voltage VT to the predetermined voltage of zero volts when a new band is selected also causes the signal-seeking operation, in the increasing frequency sense, to automatically start. As a result, when a new band is selected, the lowest frequency active channel in the new band is automatically located.

To reinitiate searching in a selected band after one active channel has been located in order to find the next active channel in one selected band, a user depresses one of a "scan up" push button 30 or a "scan down" push button 30. If up button 32 is depressed, a positive voltage received at terminal 34 is applied by way of resistor 36 to the set input of an "up" flip-flop (F—F) 38. As a result, the Q output of F—F 38 provides a high logic level signal which is applied through resistor 40 to the junction of resistor 42 and the emitter of a transistor 44. This turns transistor 44 off since its base receives a low logic level from the Q output of a "down" F—F 38a which has not been set. The high logic level signal from the Q output of F—F 38 is also applied through resistor 46 to the base of transistor 48. This turns transistor 48 on since its emitter receives the low logic signal from the Q output of F—F 38a through resistor 64. Therefore, transistor 48 draws current from a positive voltage supply terminal 50 through a collector resistor 52 which causes its collector voltage to drop to a point at which transistor 54, having its base coupled to the collector of transistor 48 by way of resistor 56, is turned on. Transistor 54 draws current from terminal 50 through an emitter resistor 58. Since, as stated above, transistor 44 is off, the collector current drawn by transistor 54 is applied to the one of capacitors 22 or 24 selected by switch 26c. Thus, the voltage on the selected capacitor rises thereby causing tuner 12 to tune in the increasing frequency sense.

This continues until detector 20 provides an output signal that indicates that an RF signal corresponding to an active channel is being received. This output signal is applied to the reset input of F—F 38 through an OR gate 60, and to the reset input of F—F 38a through OR gate 60a. Thus, the Q output of F—F 38 is caused to be at the low logic level and therefore transistor 48 is turned off. This, in turn, causes transistor 54 to turn off since the collector voltage of transistor 48 is at a high level. Transistor 44 remains off since it receives the low logic level at its base from the Q output of F—F 38a through a resistor 62 and also the low logic level at its emitter from the Q output of F—F 38 through resistor 40. Thus, the charging of the selected one of capacitors 22 and 24 is now stopped, and, as a result, the voltage on the selected capacitor remains a constant so that the signal-seeking operation is stopped.

If no RF signal corresponding to an active channel is found during the search, VT will reach a maximum value corresponding to a frequency slightly above the highest channel for the selected band. In this case, a scanning direction reversing circuit is activated. In particular, operational amplifier 70 receives at its inverting (−) input an upper limit reference voltage from terminal 72 slightly less than the maximum value of VT and VT at its non-inverting (+) input. When VT reaches the upper limit reference voltage, a high logic level is generated at the output of amplifier 70 and coupled through a resistor 74 to the set input of "down" F—F 38a and through an OR gate 60 to the reset input of "up" F—F 38. This causes the high logic level to be produced at the Q output of F—F 38a and the low logic level to be produced at the Q output of F—F 38. The high logic level from the Q output of F—F 38a is applied through resistor 64 to the junction of the emitter of transistor 48 and a resistor 76, while the low logic level from F—F 38 is applied to the base of transistor 48 through resistor 46. Thus, transistor 48 is turned off, causing its collector voltage to rise, thereby also turning off transistor 54. The high logic level from F—F 38a is also applied to the base of transistor 44 through resistor 62, while the low logic level from F—F 38 is applied to the emitter of transistor 44 through resistor 40. Thus, transistor 44 is turned on. This causes the selected one of capacitors 22 or 24 to discharge through switch 26c, transistor 44, and resistor 42. As the voltage across the selected capacitor decreases, tuner 12 progessively scans downward in frequency until an RF signal corresponding to an active channel is found, as indicated by the output signal from detector 20. The output signal from detector 20 is applied to the reset input of F—F 38a through OR gate 60a causing a low level to be produced at the Q output of F—F 38a. This causes transistor 44 to turn off so that the signal-seeking operation is stopped.

If no RF signal corresponding to an active channel is found during the downward scanning operation, VT reaches its minimum value corresponding to a frequency slightly below the lowest channel of the selected band. An operational amplifier 76, of the scanning direction reversing circuit, receives, at its non-inverting (+) input a lower limit reference voltage from terminal 78 slightly greater than the minimum value of VT and VT at its inverting input. When VT reaches the lower limit reference voltage, amplifier 76 provides the high logic level at its output which is coupled through resistor 80 to the set input F—F 38 through an OR gate 60a and to the reset input of F—F 38a. This causes F—F 38 to develop the high logic level at its Q output to initiate scanning in the increasing frequency direction.

As earlier noted, scanning in the increasing frequency direction will be automatically initiated just after a user operates manual bandswitch 26 due to the fact that the selected one of capacitors 22 or 24 has zero volts thereacross. This is so because the initial development of zero volts across the selected one of capacitors 22 and 24 causes amplifier 76 to provide the high logic level at its output which in turn set "up" F—F 38. Thus, the lowest frequency active channel in a newly selected band will automatically be located after manual bandswitching without the need for a viewer to depress "up" button 30.

When "down" push button switch 32 is depressed by the user, the positive voltage at terminal 34 is applied through switch 32 and resistor 36a to the set input of F—F 38a. Thus, the Q output of F—F 38a is caused to be at the high logic level which causes scanning in the decreasing frequency sense as explained above, provided that tuner 12 is not already tuned to the lowest channel of the selected band. If tuner 12 is tuned to the lowest frequency channel, which may occur after bandswitching due to the discharging action of resistor 28 as explained above, then depressing push button 32 causes the scanning direction reversing circuit to initiate scanning in the increasing frequency sense.

It will be appreciated that modifications to the preferred embodiment are possible within the scope of the invention. For example, while the present invention has been functionally described in terms of set-reset flip-flops, set-reset F—Fs 38 and 38a can be replaced by other types of flip-flops such as a data (D) flip-flop. In addition, a circuit for providing a pause when an active channel is located may be added to give a user more time to release the depressed one of pushed buttons 30 and 32.

What is claimed is:

1. In a receiver signal-seeking tuning apparatus, comprising:
    tuning means responsive to the magnitude of a tuning signal for tuning said receiver to receive RF signals occuring in at least two frequency bands to produce an IF signal;
    tuning signal generating means responsive to said IF signal produced by said tuning means for generating said tuning signal and changing its magnitude until one of said received RF signals corresponds to an active channel;
    band selection means coupled to said tuning signal generating means and manually operable by a user for selecting the frequency band in which said tuning means is to tune; and
    search initiating means coupled to said tuning signal generating means and responsive to the manual operation of said band selection means by a user to select the frequency band in which said tuning means is to tune for causing the magnitude of said tuning signal to change in a predetermined sense from a predetermined magnitude when a new band is selected;

said tuning signal generating means including a first capacitor for developing a tuning signal for a first band of frequencies; and a second capacitor for developing a tuning signal for a second band of frequencies;

said search initiating means including charging means for initially charging the one of said first and second capacitors corresponding to the selected band to a predetermined tuning signal level when it is initially selected by the manual operation of said band selection means by a user.

2. The apparatus as claimed in claim 1, wherein: said bands include a VHF television band and a UHF television band.

3. The apparatus as claimed in claim 1, wherein: said first band has fewer channels than said second band; and
said second capacitor has a higher capacitance value than said first capacitor.

4. The apparatus as claimed in claim 1, wherein: said predetermined tuning signal level for each band corresponds to a respective frequency substantially at a boundary of the band.

5. Apparatus as claimed in claim 1, wherein: said charging means is coupled to said band selection means for allowing said tuning signal to be developed across the one of said capacitors corresponding to a currently selected band and for holding the capacitor corresponding to the non-selected band at its said respective predetermined tuning signal level until said non-selected band is selected.

6. Apparatus as claimed in claim 1, wherein: said tuning signal generating means includes direction selection means for changing the sense of charging of the capacitor corresponding to the currently selected band.

7. The apparatus as claimed in claim 6, wherein: said frequency bands each have respective pairs of upper and a lower frequency boundaries; and
said tuning signal generating means includes direction reversing means for changing the sense of tuning upon reaching one of the two frequency boundaries of a currently selected band.

8. A television system comprising:
a tuner responsive to a tuning voltage for tuning RF signals in the VHF and UHF television bands;
first and second capacitors for developing said tuning voltage when said tuner is tuning in said VHF and UHF bands, respectively;
manual bandswitching means, coupled to said capacitors, for coupling a selected one of said first and second capacitors to said tuner and for setting the other of said first and second capacitors to a predetermined charge;
a signal-seeking detector, coupled to said tuner for providing an output signal indicative of proper tuning of an RF signal corresponding to an active channel;
first and second manually operable switches; and
charging means, coupled to said detector, to said selected capacitor, and to said switches, for charging said selected capacitor to provide signal-seeking in a first frequency changing direction in accordance with the operation of said first switch and for discharging said selected capacitor for providing signal-seeking in a second frequency changing direction in accordance with the operation of said second switch and for stopping said charging and discharging and thus stopping said signal-seeking in response to said detector output signal.

9. The apparatus as claimed in claim 8 wherein: each of said UHF and VHF bands have respective pairs of upper and lower frequency boundaries, said apparatus; and further including
direction reversing means, coupled to said charging means and to said selected capacitor, for reversing the frequency changing direction of said signal-seeking when said tuning voltage corresponds to one of the two frequency boundaries of the band corresponding to said selected capacitor.

10. Signal-seeking apparatus comprising:
a tuner capable of tuning RF signals in first and second frequency bands in response to a tuning voltage having a variable magnitude for providing on IF signal;
tuning voltage generating means for generating said variable magnitude tuning voltage, said tuning voltage generating means being responsive to said IF signal provided by said tuning means;
a first and second storing means for storing said tuning voltage for said first and second bands, respecively; and
manual bandswitching means coupled to said tuner for selecting one of said first and second frequency bands in which it is to tune and coupled to said storing means for selecting one of said first and second storing means to develop said variable tuning voltage and causing the other of said first and second storing means to develop a predetermined tuning voltage level.

* * * * *